(12) United States Patent
Karrer et al.

(10) Patent No.: US 8,286,469 B2
(45) Date of Patent: Oct. 16, 2012

(54) INSERT MOLDED ELECTRICAL CONTACT

(75) Inventors: Helmut Karrer, Fürth (DE); Jürgen Henniger, Erlangen (DE); Andreas Schulze, Lauf (DE); Matthias Wieczorek, Neunkirchen a. Sand (DE); Alexander Wenk, Burgoberbach (DE); Ingrid Farnbacher, Fürth (DE)

(73) Assignee: Conti Temic Microelectronic GmbH (DE)

( * ) Notice: Subject to any disclaimer, the term of this patent is extended or adjusted under 35 U.S.C. 154(b) by 444 days.

(21) Appl. No.: 12/531,622

(22) PCT Filed: Feb. 2, 2008

(86) PCT No.: PCT/DE2008/000189
§ 371 (c)(1),
(2), (4) Date: Oct. 16, 2009

(87) PCT Pub. No.: WO2008/113312
PCT Pub. Date: Sep. 25, 2008

(65) Prior Publication Data
US 2010/0071449 A1    Mar. 25, 2010

(30) Foreign Application Priority Data
Mar. 19, 2007   (DE) .......................... 10 2007 014 279

(51) Int. Cl.
*G01M 15/00* (2006.01)
(52) U.S. Cl. .................................................. 73/114.25
(58) Field of Classification Search ............... 73/114.25, 73/114.26, 114.77, 115.01, 155.02, 115.08
See application file for complete search history.

(56) References Cited

U.S. PATENT DOCUMENTS

| 6,287,502 | B1 | 9/2001 | Onoda |
| 6,427,316 | B1 | 8/2002 | Shinjo et al. |
| 7,201,043 | B2 * | 4/2007 | Yamada et al. ............ 73/114.21 |
| 7,269,992 | B2 * | 9/2007 | Lamb et al. ................... 73/1.41 |
| 7,726,269 | B2 * | 6/2010 | Ramond et al. .......... 123/143 R |
| 2002/0100333 | A1 * | 8/2002 | Gravel et al. .................. 73/756 |
| 2003/0033875 | A1 * | 2/2003 | Iijima et al. ................... 73/494 |
| 2005/0115317 | A1 * | 6/2005 | Fouquet ......................... 73/494 |
| 2006/0169059 | A1 * | 8/2006 | Kawasaki et al. .......... 73/862.08 |
| 2006/0218997 | A1 * | 10/2006 | Yamada et al. ................. 73/115 |
| 2006/0283232 | A1 * | 12/2006 | Lamb et al. .................... 73/1.41 |
| 2007/0163329 | A1 * | 7/2007 | Last et al. .................... 73/35.12 |
| 2008/0202250 | A1 * | 8/2008 | Koehler et al. ................. 73/756 |
| 2008/0216786 | A1 * | 9/2008 | Ramond et al. .......... 123/143 A |
| 2008/0250862 | A1 * | 10/2008 | Nakabayashi .................. 73/756 |
| 2008/0257036 | A1 * | 10/2008 | Chaudoreille et al. ........ 73/32 A |
| 2009/0044628 | A1 * | 2/2009 | Lotscher ......................... 73/654 |
| 2010/0005859 | A1 * | 1/2010 | Ito et al. ....................... 73/35.11 |
| 2010/0212621 | A1 * | 8/2010 | Ramond et al. .......... 123/145 R |

FOREIGN PATENT DOCUMENTS

| DE | 36 11 224 A1 | 10/1987 |
| DE | 10 2005 039 086 A1 | 2/2007 |
| WO | WO 93/14618 | 7/1993 |

* cited by examiner

*Primary Examiner* — Eric S McCall
(74) *Attorney, Agent, or Firm* — RatnerPrestia

(57) ABSTRACT

A sensor arrangement has a sensor element. A contact element is in electrical contact on the one hand with the sensor element and on the other with contact pins. The contact element is insert moulded with a plastic body. Affixing positions to which the contact element has been affixed, and on which the contact element is exposed respectively have one collar made of plastic material which runs around the exposed areas of the contact element. A sensor arrangement results for which the cost of manufacture is lower than that of the prior art, while the same security against unwanted electrostatic discharging or against the formation of an unwanted short circuit remains.

8 Claims, 3 Drawing Sheets

INSERT MOLDED ELECTRICAL CONTACT

CROSS REFERENCE TO RELATED APPLICATIONS

This application is the U.S. national phase application of PCT International Application No. PCT/DE2008/000189, filed Feb. 2, 2008, which claims priority to German Patent Application No. DE 10 2007 014 279.1, filed Mar. 19, 2007, the contents of such applications being incorporated by reference herein.

BACKGROUND OF THE INVENTION

1. Field of the Invention

The invention relates to a sensor arrangement.

2. Description of the Related Art

Sensor arrangements are used in particular in the automobile industry. The installation site of such sensor arrangements is in particular a gearbox or engine compartment of a motor vehicle. The sensor elements of a sensor arrangement of this type are used for example to determine an engine speed or assembly path. The sensor elements are electrically contacted to external read-out or control devices via the contact pins. Contact elements are here surrounded by a plastic body.

SUMMARY OF THE INVENTION

An object of the present invention is to further develop a sensor arrangement of the type described in the introduction in such a manner that the cost of manufacturing it is reduced while maintaining the same level of security against unwanted electrostatic discharge, or against the formation of an unwanted short circuit.

According to aspects of the invention, it has been recognised that no dual-stage injection method for surrounding the contact element with the plastic body is necessary when collars made of synthetic material are provided which run around the affixing positions. As a result, the distance between a surface of the plastic body which is adjacent to the affixing position on the one hand and an exposed area of the contact element on said affixing position on the other is enlarged to such a size that during the mounting of the sensor arrangement or the remaining motor vehicle, and during the use of the motor vehicle, neither an electric discharge nor a short circuit can occur. In particular, due to the collar, a distance between the exposed areas of adjacent affixing positions is enlarged in such a manner that no short circuits, for example as a result of metal shavings, in particular when the sensor arrangement is used in a gearbox, can occur.

An embodiment of a collar can be produced at a low cost when for example the collar is also generated when the plastic body is insert moulded.

A lid according to at least one embodiment protects the sensor element. The lid can completely cover the sensor element. Alternatively, it is possible that the lid only covers the sensor element where protection against unwanted electrostatic discharge or a short circuit is required.

The advantages of the method according to aspects of the invention correspond to those which have already been discussed with reference to the sensor arrangement according to aspects of the invention.

A connecting body according to at least one embodiment makes it easier to mount the sensor arrangement. The connecting body also secures the contactability of the contact pins after the connecting body has been loosened if the connecting body is connected to the contact element via the free contact ends of the contact pins.

A connecting body according to one or more aspects of the invention also ensures a correct relative positioning of the contact paths of the contact element which are assigned to the contact pins.

A connection of the connecting body with the contact element via the contact pins also ensures that the connecting body can be removed during the course of manufacturing the sensor arrangement without leading to exposed areas, on which unwanted electrostatic discharges or short circuits may occur.

By means of caulking in accordance with one or more aspects of the invention, the exposed areas of the contact element can be completely closed. As a result, protection against shavings, or a seal against shavings is in particular guaranteed.

BRIEF DESCRIPTION OF THE DRAWINGS

Exemplary embodiments of the invention will now be explained in greater detail below with reference to the drawing, in which.

DETAILED DESCRIPTION OF THE PREFERRED EMBODIMENTS

Figure 1:
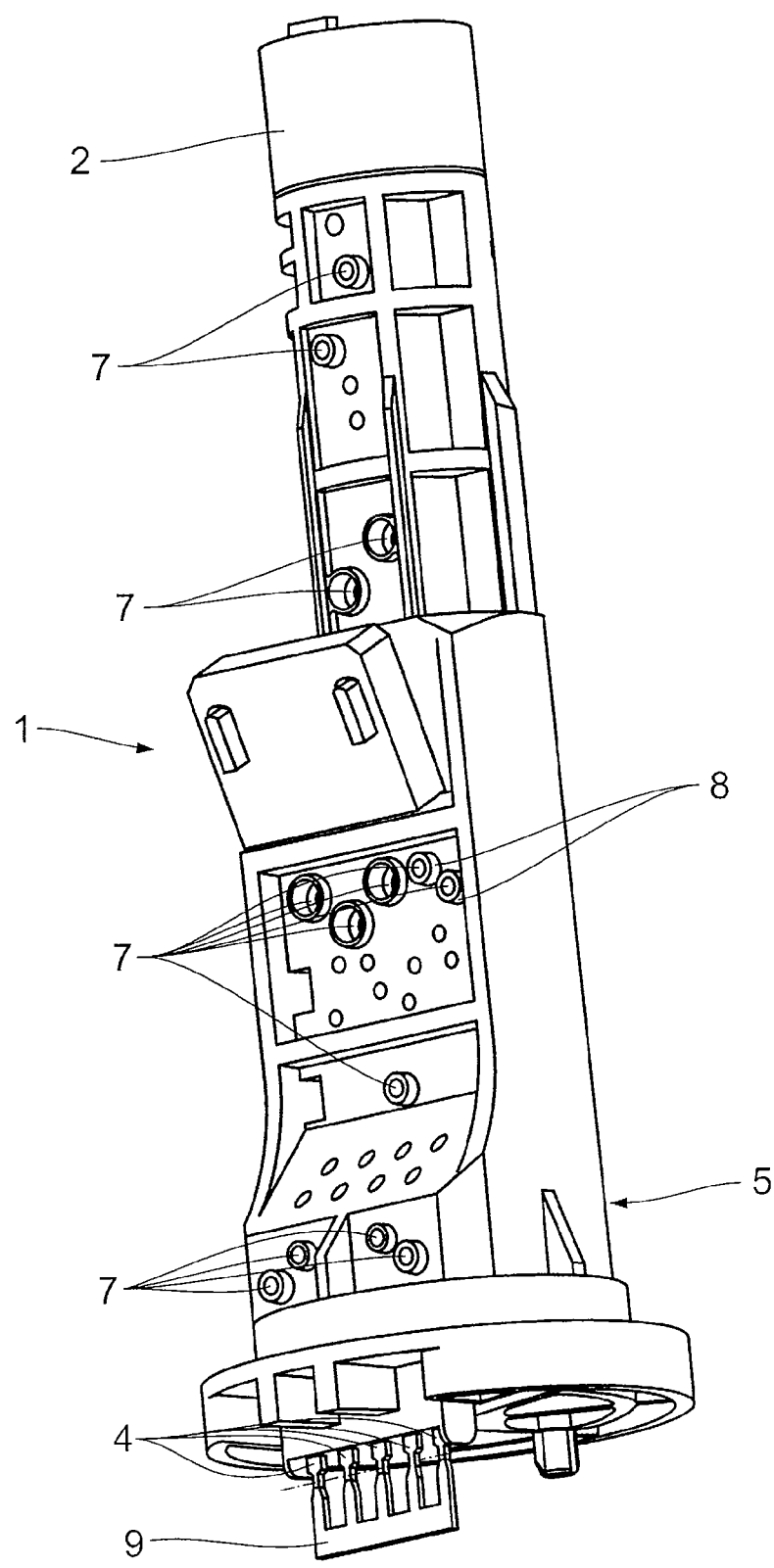
FIG. 1 shows a perspective view of a sensor arrangement.

A sensor arrangement 1 has a sensor element with the embodiment shown in FIG. 1 which is covered by a shaving protection lid 2 and which is thus not visible. The arrangement of the sensor element of the embodiment shown in FIG. 1 corresponds to that of a sensor element 3 of the further embodiment of a sensor arrangement shown in FIGS. 2 and 3.

In order to connect the signal of the sensor element with an external read-out and control device not shown in greater detail, contact pins 4 are used. The latter are arranged on one end of the plastic body 5 of the sensor arrangement 1 which lies opposite the sensor element. The plastic body 5 is also known as a sensor dome. The shaving protection lid 2 which is used to protect the sensor element 3 is in particular removably connected to the plastic body 5, for example by latching with it or by being hot caulked to it. Overall, with the embodiment shown in FIG. 1, five contact pins 4 which have been drawn out of the plastic body 5 lie adjacent to each other.

A contact element 6, also known as a punch scrap, is in electrical contact with the sensor element on the one hand and the contact pins 4 on the other. The contact element 6 is made of a copper alloy. The contact element 6 forms conducting or contact tracks which are respectively assigned to the contact pins, and which lead from the respective connection points of the sensor element 3 through to the contact pins 4. The contact element 6 is insert moulded with the plastic body 5. Here, a single-stage insert moulding method is used. With this single-stage insert moulding method, the contact element 6 is retained or held at affixing positions 7 in an injecting tool. Overall, fourteen affixing positions 7 of this type face the viewer from the perspective shown in FIG. 1. After the insert moulding, there is therefore no other injected plastic on the affixing positions 7; the affixing positions 7 are therefore exposed.

Around the areas of the affixing positions 7 which are bare of the plastic material following the insert moulding, the affixing positions 7 respectively comprise one circumferential collar 8 which is made of the injected plastic material. Depending on the form of the retaining elements of the injecting tool, the collar 8 is here formed with a different diameter and different collar wall thicknesses. With the sensor arrangement 1 shown in FIG. 1, five collars 8 with a comparatively large diameter and a comparatively low wall thickness, and nine collars 8 with a comparatively small diameter and a comparatively large wall thickness are present. The collars 8 protrude over the remaining plastic body 5 by approximately 1 mm.

On the collars 8 with a smaller diameter, the punch scrap 6 is held, i.e. affixed. With the collars 8 with a larger collar diameter, the punch scrap 6 is retained and affixed. For this retention, the punch scrap 6 has a drill hole.

Since the collars 8 are produced during the insert moulding of the contact element 6 with the plastic material which creates the structure of the plastic body 5, the collars 8 are formed as a single piece onto the plastic body 5.

The collars 8 ensure that the areas of the affixing positions 7 which are bare of the plastic material do not form unwanted contacts with external components or with shavings.

While the sensor arrangement 1 is being manufactured, the ends of the contact pins 4 which are later free are connected with each other via a connecting web or connecting body 9. The connecting web 9 is in general exposed, i.e. it is not insert moulded. The connecting web 9 thus lies completely outside the plastic body 5.

Figure 2:
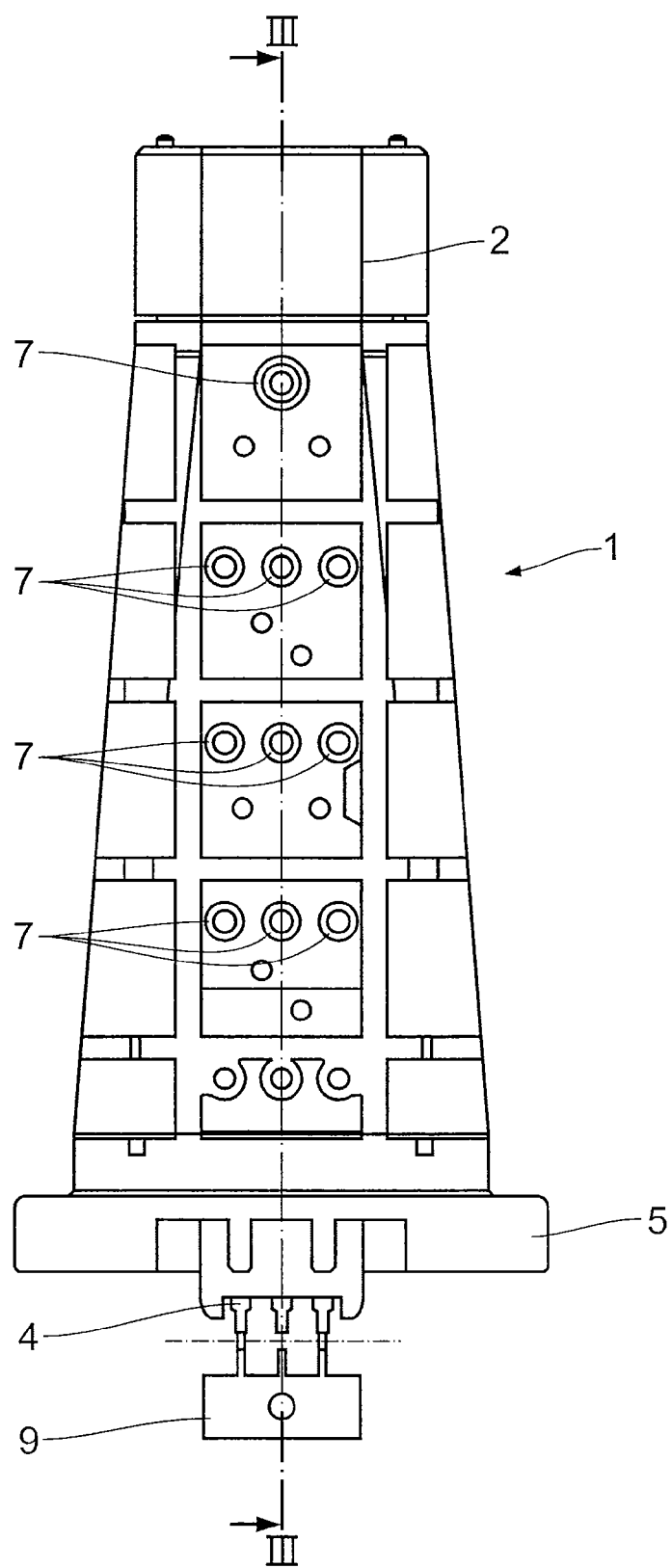
FIG. 2 shows a view of a further embodiment of a sensor arrangement.

The sensor arrangement 1 shown in FIG. 1 is manufactured in the following manner: First, the contact element 6 is inserted into the injection moulding tool. Due to the fact that the individual conducting tracks are pre-positioned relative to each other via the connecting web 9, this insertion is easier than inserting all conducting tracks of the contact element 6 individually. The contact element 6 is then insert moulded with the plastic body 5. The sensor element 3 is then inserted into a retainer 10 (ref. FIG. 2) of the plastic body 5, and contact pins 11 of the sensor element 3 are connected with the assigned conducting tracks of the contact element 6 (ref. here also FIG. 3). The shaving protection lid 2 is then placed onto the plastic body 5 and connected with it.

When insert moulding the contact element 6 in precisely one injection stage, the collars 8 are formed at the same time. Ultimately, the connecting web 9 is cut out of the contact pins 4, so that the free ends of the contact pins 4 are exposed for connection to an external read-out and control device.

Additionally, the formed collars 8 can be caulked over the affixing positions 7, so that the material from the collars 8 closes the exposed areas of the affixing positions. As a result, further security against unwanted electrical contact from outside is created.

Figure 3:
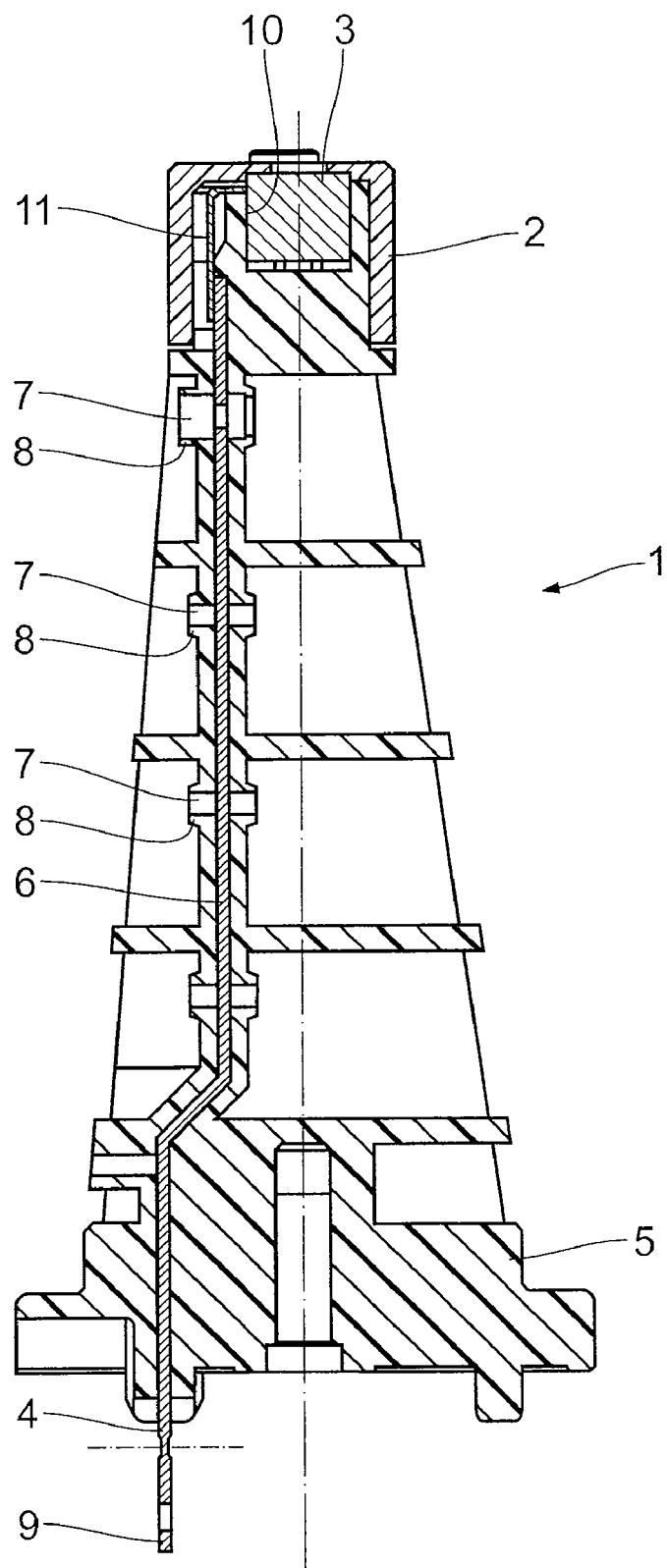
FIG. 3 shows a section according to line III-III in FIG. 2.

FIGS. 2 and 3 show a further embodiment of a sensor arrangement 1. Components which correspond to those which are explained above with reference to FIG. 1 are assigned the same reference numerals, and are not discussed in detail again.

The sensor arrangement 1 shown in FIGS. 2 and 3 differs from that shown in FIG. 1 due to the size and shape of the plastic body or sensor dome 5, and due to the arrangement of the affixing positions 7 and the design of their collars 8. With the sensor arrangement 1 shown in FIGS. 2 and 3, one sleeve in total with a comparatively large diameter is present, and furthermore, nine affixing positions 7 with collars 8 with a comparatively small diameter are also present.

It can be seen from the section shown in FIG. 3 that on the affixing positions 7, the contact element 6 is held by two opposite sides respectively in the injection tool.

In contrast to the embodiment shown in FIG. 1, the embodiment of the sensor arrangement 1 shown in FIGS. 2 and 3 comprises a total of three contact pins 4 which are drawn out of the plastic body 5.

The manufacture of the sensor arrangement 1 shown in FIGS. 2 and 3 corresponds to that of the sensor arrangement 1 shown in FIG. 1.

The invention claimed is:

1. A sensor arrangement comprising: a sensor element; and a contact element which is in electrical contact with the sensor element, wherein the contact element is insert moulded within a plastic body, wherein the contact element is affixed to the plastic body at affixing positions on the plastic body, wherein each affixing position comprises a hole disposed through a surface of the plastic body through which a portion of the contact element is exposed and a collar made of plastic material which protrudes from the surface of the plastic body and extends around the hole.

2. A sensor arrangement according to claim 1, wherein the collars are respectively formed onto the plastic body as a single piece.

3. A sensor arrangement according to claim 1 further comprising a lid connected to the plastic body which covers the sensor element at least in sections.

4. A method for manufacturing a sensor arrangement according to claim 1 comprising:
   insert moulding the contact element in one injection stage;
   contacting the sensor element with the contact element; and
   forming the collars around the affixing positions.

5. A method according to claim 4, wherein, during the insert moulding, the collars are formed around the affixing positions at the same time.

6. A method according to claim 4, wherein, after the collars are formed, the collars are caulked over the affixing positions such that, after the caulking procedure, areas of the contact element which were previously exposed are no longer exposed on the affixing positions.

7. A method according to claim 4, wherein, during the insert moulding, the contact element is held by a connecting body which is formed as a single piece onto the contact element, and, after the insert moulding, the contact element is separated from the connecting body.

8. A method according to claim 7, wherein the contact element is connected on the connecting body via contact pins.

* * * * *